US009250263B2

(12) United States Patent
Nakamura et al.

(10) Patent No.: US 9,250,263 B2
(45) Date of Patent: Feb. 2, 2016

(54) SOCKET AND ELECTRONIC DEVICE TEST APPARATUS

(71) Applicant: ADVANTEST CORPORATION, Tokyo (JP)

(72) Inventors: Kiyoto Nakamura, Miyagi (JP); Takashi Fujisaki, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/618,070

(22) Filed: Feb. 10, 2015

(65) Prior Publication Data

US 2015/0153388 A1    Jun. 4, 2015

Related U.S. Application Data

(62) Division of application No. 13/644,197, filed on Oct. 3, 2012, now Pat. No. 8,988,095.

(30) Foreign Application Priority Data

Oct. 4, 2011  (JP) .................................. 2011-219943

(51) Int. Cl.
*G01R 31/00* (2006.01)
*G01R 1/04* (2006.01)
(Continued)

(52) U.S. Cl.
CPC ............ *G01R 1/0433* (2013.01); *G01R 1/0466* (2013.01); *G01R 1/0483* (2013.01); *G01R 31/2601* (2013.01); *G01R 1/0735* (2013.01); *G01R 31/2886* (2013.01)

(58) Field of Classification Search
CPC ............. G01R 31/2889; G01R 1/0483; G01R 1/0408; G01R 1/045; G01R 1/06716; G01R 31/2863

USPC ................ 324/754.01–754.3, 756.01–756.07
See application file for complete search history.

(56) References Cited

U.S. PATENT DOCUMENTS 5,757,199 A      5/1998  Maruyama
5,975,915 A  *  11/1999  Yamazaki ............ G01R 1/0433
                                                                  439/331

(Continued)

FOREIGN PATENT DOCUMENTS

CN           1181528         12/2004
CN           1612321          5/2005

(Continued)

OTHER PUBLICATIONS

Korean Office action, mail date is Aug. 28, 2013.

(Continued)

*Primary Examiner* — Tung X Nguyen
(74) *Attorney, Agent, or Firm* — Greenblum & Bernstein, P.L.C.

(57) ABSTRACT

A socket is electrically connected to a test carrier. The test carrier includes a film-shaped first member on which at least one internal terminal, which contacts at least one electrode of an electronic device, is provided; and at least one external terminal which is electrically connected to the internal terminal. The socket includes: at least one contactor which contacts the external terminal; and a first pusher which pushes a portion of the first member where the internal terminal is provided and a portion of the first member surrounding the internal terminal. The first pusher includes: a bag member which has a sealed space within the bag member; and a fluid which is housed in the sealed space.

4 Claims, 12 Drawing Sheets

(51) Int. Cl.
*G01R 31/26* (2014.01)
*G01R 1/073* (2006.01)
*G01R 31/28* (2006.01)

(56) References Cited

U.S. PATENT DOCUMENTS

| | | | |
|---|---|---|---|
| 6,062,873 | A | 5/2000 | Kato |
| 6,563,330 | B1 | 5/2003 | Maruyama et al. |
| 6,774,650 | B2 | 8/2004 | Maruyama et al. |
| 7,235,413 | B2 | 6/2007 | Hasebe et al. |
| 7,601,018 | B2 * | 10/2009 | Hwang ................ G01R 1/0483 439/331 |
| 2003/0160626 | A1 | 8/2003 | Maruyama et al. |
| 2005/0093565 | A1 | 5/2005 | Okamoto et al. |
| 2005/0095734 | A1 | 5/2005 | Hasebe et al. |
| 2007/0207559 | A1 | 9/2007 | Hasebe et al. |
| 2008/0020498 | A1 | 1/2008 | Okamoto et al. |
| 2010/0304510 | A1 | 12/2010 | Okamoto et al. |
| 2011/0136272 | A1 | 6/2011 | Okamoto et al. |
| 2011/0175634 | A1 | 7/2011 | Okamoto et al. |

FOREIGN PATENT DOCUMENTS

| | | |
|---|---|---|
| JP | 07-034590 | 8/1995 |
| JP | 7-263504 | 10/1995 |
| JP | 2005-249448 | 9/2005 |

OTHER PUBLICATIONS

Korea Office action, mail date is Jan. 13, 2014.
China Office action, mail date is Aug. 20, 2014.

* cited by examiner

SOCKET AND ELECTRONIC DEVICE TEST APPARATUS

This application is a divisional application of U.S. patent application Ser. No. 13/644,197, filed Oct. 3, 2012, now U.S. Pat. No. 8,988,095 which is based on and claims priority of Japanese Patent Application No. 2011-219943 filed on Oct. 4, 2011, the disclosures of which are expressly incorporated by reference herein.

TECHNICAL FIELD

The present invention relates to a socket to which a test carrier, in which a die chip or other electronic device in which an integrated circuit or other electronic circuit is formed is temporarily mounted, is electrically connected and to an electronic device test apparatus which comprises that socket.

BACKGROUND ART

Known in the art is a test carrier which comprises a contact sheet having a thickness 0.05 to 0.1 mm or so film made of polyimide on which contact pads and interconnect patterns are formed. The contact pads correspond to electrode patterns of a chip under test and the interconnect patterns are connected to the contact pads and secure contact with an external test apparatus (for example, see PLT 1).

CITATIONS LIST

Patent Literature

PLT 1: Japanese Patent Publication No. 7-263504 A1

SUMMARY OF INVENTION

Technical Problem

If the density of the contact pads or interconnect patterns becomes higher, sometimes the stress at the time of formation of the interconnects causes slight waviness to the thin film of the contact sheet. If waviness occurs in the film of the contact sheet, a spot where the contact pad is not electrically connected with the electrode of the chip will arise and there is the problem that contact defects will sometimes occur.

The technical problem of the present invention is the provision of a socket and an electronic test apparatus which can suppress the occurrence of contact defects.

Solution to Problem

[1] socket according to the present invention is a socket to which a test carrier is electrically connected, the test carrier which has: a film-shaped first member on which at least one internal terminal which contacts at least one electrode of an electronic device is formed; and at least one external terminal which is electrically connected to the internal terminal, the socket comprising: at least one contactor which contacts the external terminal; and a first pusher which pushes a portion of the first member where the internal terminal is formed and a portion of the first member surrounding the internal terminal, wherein the first pusher has: a first elastic member; and a second elastic member which is softer than the first elastic member, is laid over the first elastic member, and contacts the first member.

[2] In the invention, the second elastic member may have a front surface which has a projecting shape which gradually becomes higher with distance to a center of the projecting shape.

[3] A socket according to the present invention is a socket to which a test carrier is electrically connected, the test carrier which has: a film-shaped first member on which at least one internal terminal which contacts at least one electrode of an electronic device is formed; and at least one external terminal which is electrically connected to the internal terminal, the socket comprising: at least one contactor which contacts the external terminal; and a first pusher which pushes a portion part of the first member where the internal terminal is formed and a portion of the first member surrounding the internal terminal, wherein the first pusher has an elastic member which becomes softer in stages or gradually with distance to the first member.

[4] In the invention, the elastic member may have a front surface which has a projecting shape which gradually becomes higher with distance to a center of the projecting shape.

[5] A socket according to the present invention is a socket to which a test carrier is electrically connected, the test carrier which has: a film-shaped first member on which at least one internal terminal which contacts at least one electrode of an electronic device is formed and at least one external terminal which is electrically connected to the internal terminal, the socket comprising: at least one contactor which contacts the external terminal; and a first pusher which pushes a portion of the first member where the internal terminal is formed and a portion of the first member surrounding the internal terminal, wherein the first pusher has: a bag member which has a sealed space inside it; and a fluid which is housed in the sealed space.

[6] An electronic device test apparatus according to the present invention is an electronic device test apparatus which tests an electronic device which is temporarily mounted to the test carrier, the electronic device test apparatus comprising: the above socket; a contacting device which brings the external terminal and the contactor into contact; and a second pusher which pushes the test carrier from a direction opposite to the pushing direction of the first pusher.

[7] In the invention, the second pusher may also push a second member of the test carrier which holds the electronic device with a first member.

[8] In the invention, the electronic device may also be a die which is diced from a semiconductor wafer.

Advantageous Effects of Invention

In the present invention, a first pusher which has a plurality of types of flexibility is used to push a portion of the first member where internal terminal is formed and to push a portion of the first member around the internal terminal. For this reason, it is possible to push and extend the film-shaped first member to eliminate waviness while making the internal terminal of the test carrier contacts the electrode of the electronic device, so it is possible to suppress contact defects between electrodes and internal terminals.

DESCRIPTION OF EMBODIMENTS

Below, a first embodiment of the present invention will be explained based on the drawings.

Figure 1:
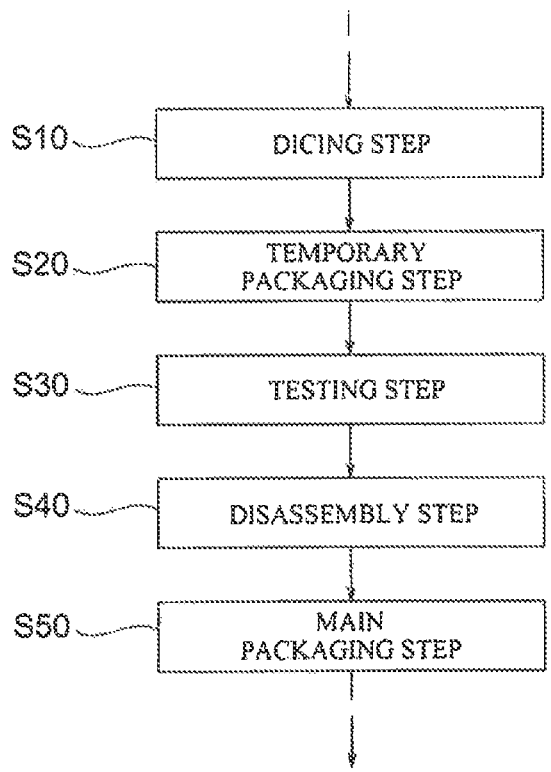
FIG. 1 is a flow chart which shows part of a device production process in an embodiment of the present invention.

FIG. 1 is a flow chart which shows part of a device production process in the present embodiment.

In the present embodiment, after a semiconductor wafer is diced (after step S10 of FIG. 1) and before the final packaging (before step S50), the electronic circuits which are built into a die 50 are tested (step S20 to S40).

In the present embodiment, first, a carrier assembly apparatus (not shown) is used to temporarily mount the die 50 into a test carrier 20 (step S20). Next, through this test carrier 20, the die 50 and the test circuit 15 of the electronic device test apparatus 10 (see FIG. 7) are electrically connected and the electronic circuits which are built into the die 50 are tested (step S30). Further, after this test, the die 50 is taken out from the test carrier 20 (step S40), then the die 50 is packaged whereby the device is completed as a final product (step S50).

First, the configuration of the test carrier 20 into which the die 50 is temporarily mounted (provisionally packaged) for the test in the present embodiment will be explained while referring to FIG. 2 to FIG. 6.

Figure 4:
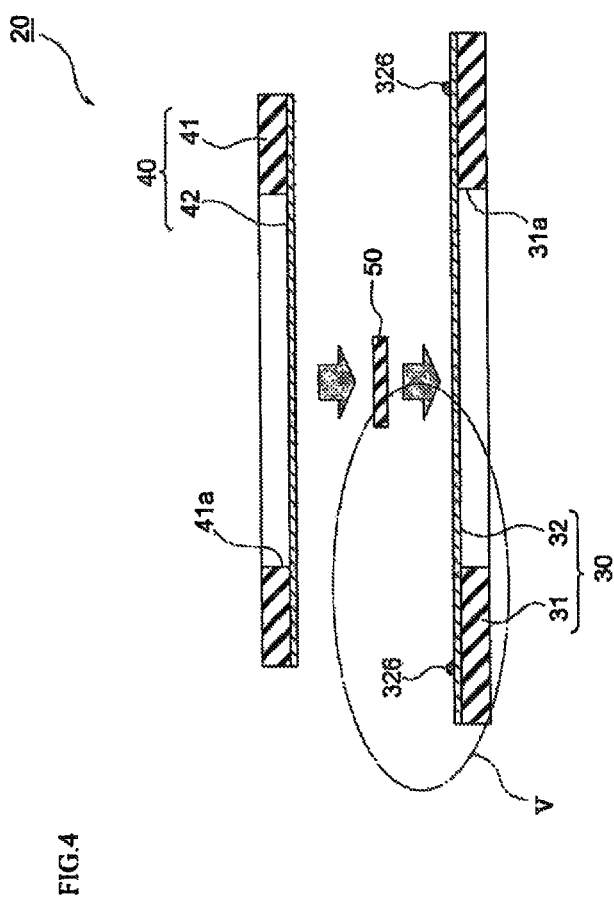
FIG. 4 is a disassembled cross-sectional view of a test carrier in an embodiment of the present invention.
Figure 5:
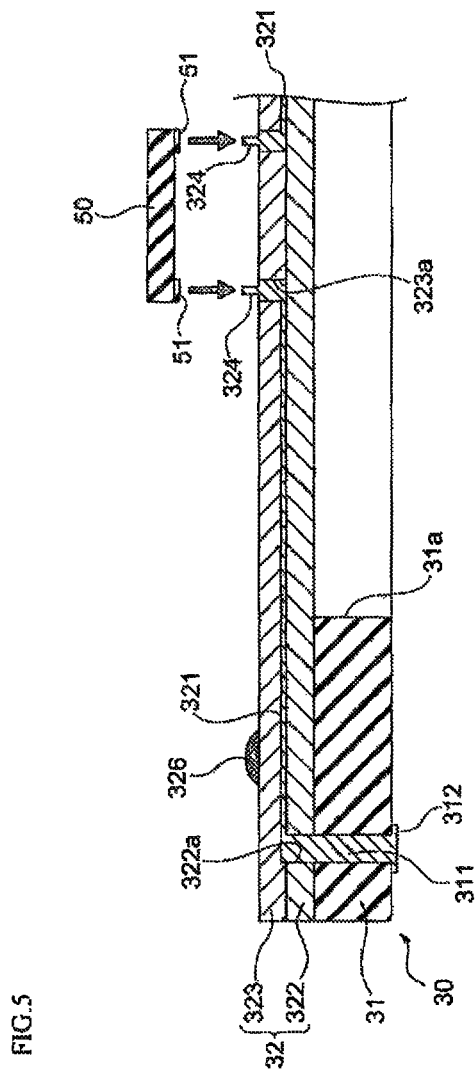
FIG. 5 is an enlarged view of a part V of FIG. 4.
Figure 6:
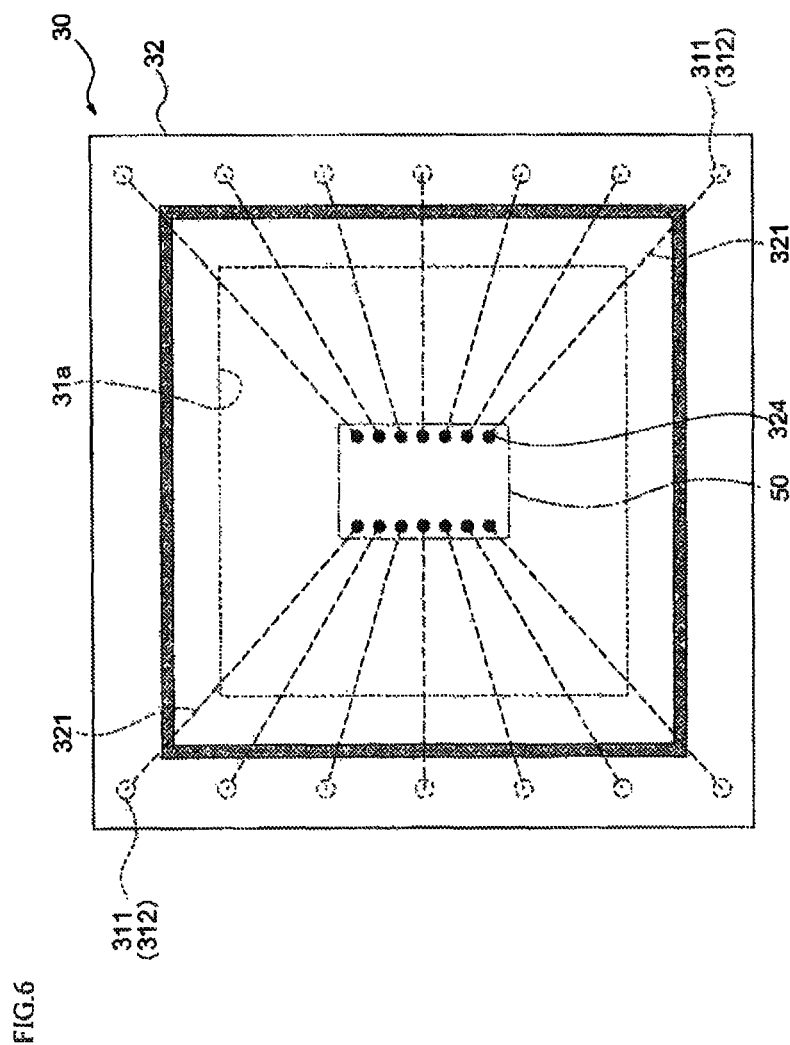
FIG. 6 is a plan view which shows a base member of a test carrier in an embodiment of the present invention.

FIG. 2 to FIG. 5 are views which show as test carrier in the present embodiment, while FIG. 6 is a plan view which shows as base member of the test carrier.

Figure 2:
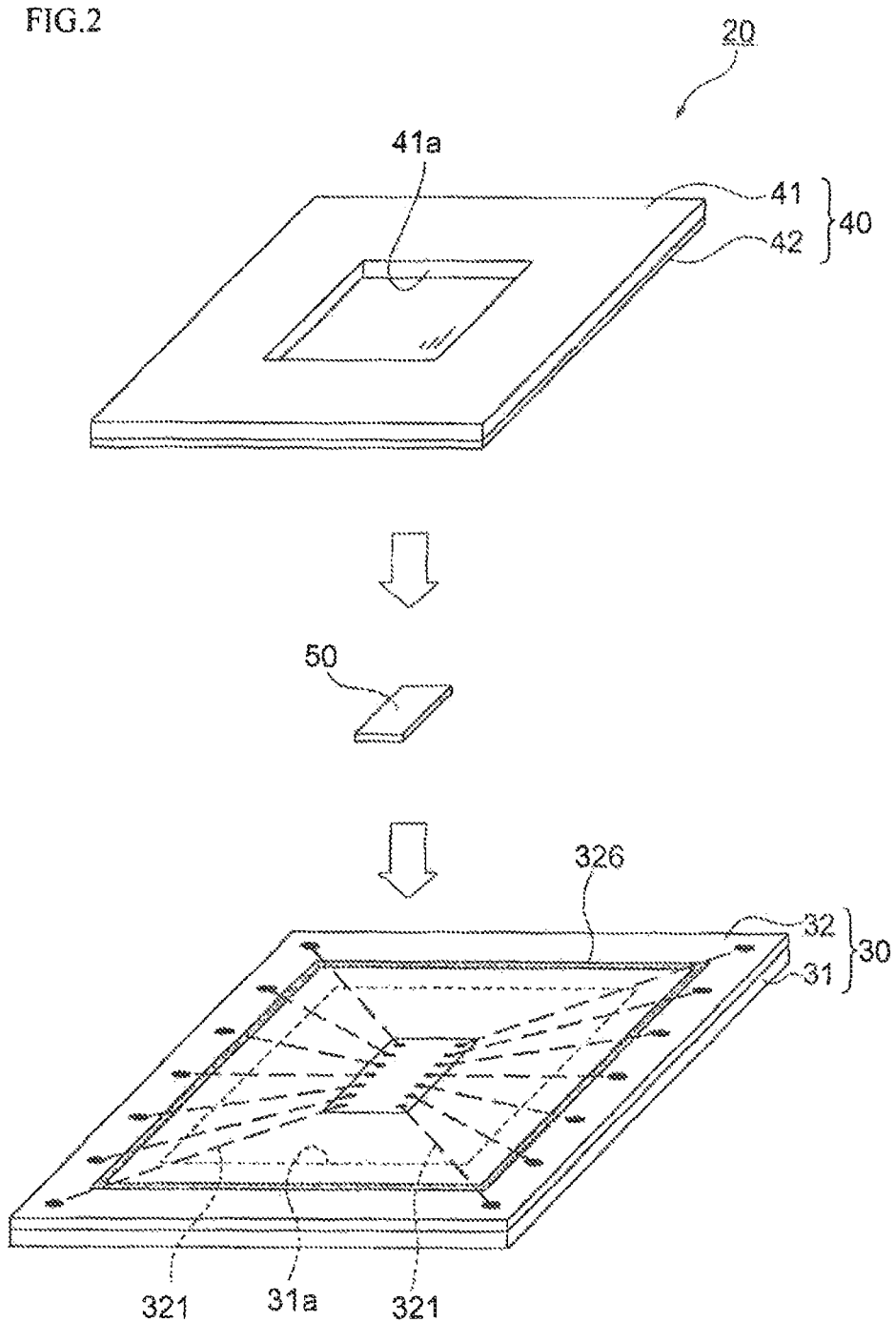
FIG. 2 is a disassembled perspective view of a test carrier in an embodiment of the present invention.
Figure 3:
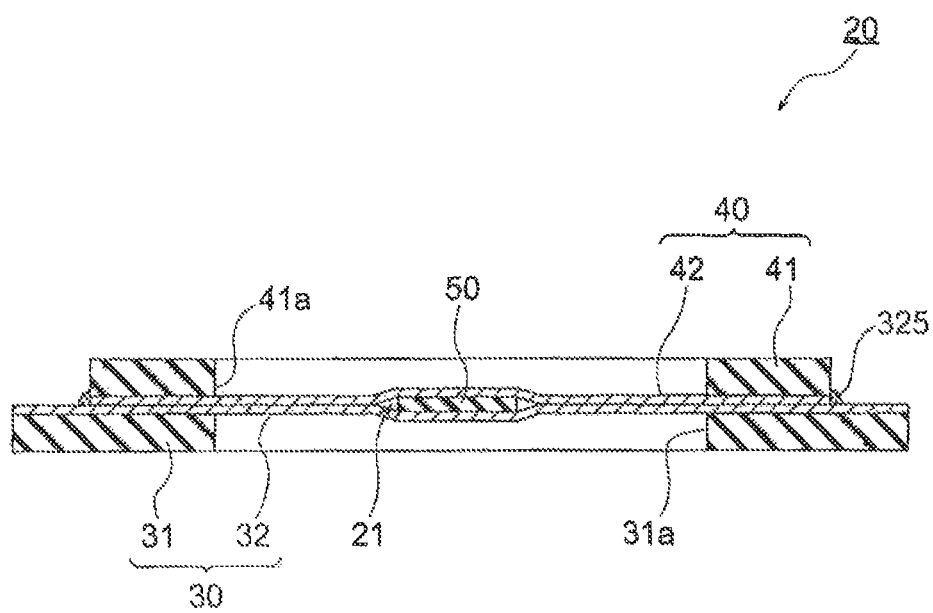
FIG. 3 is a cross-sectional view of a test carrier in an embodiment of the present invention.

A test carrier 20 in the present embodiment, as shown in FIG. 2 to FIG. 4, comprises: a base member 30 on which a die 50 is placed; and a cover member 40 which is covered over the base member 30. This test carrier 20 holds the die 50 by having the die 50 interposed between the base member 30 and the cover member 40 in a state reduced in pressure from atmospheric pressure.

The base member 30 comprises a base frame 31 and a base film 32. Note that, the base film 32 in the present embodiment is equivalent to one example of the first member in the present invention.

The base frame 31 is a rigid board which has a high rigidity (at least a rigidity higher than the base film 32 or the cover film 42) and is formed with an opening 31a at its center. As the material which forms this base frame 31, for example, a polyamide imide resin, ceramic, glass, etc. may be mentioned.

On the other hand, the base film 32 is a film which has flexibility. It is attached to the entire surface of the base frame 31, including the center opening 31a, through a binder (not shown). In this way, in the present embodiment, a base frame 31 with a high rigidity is attached to the base film 32 which has flexibility, so the handling ability of the base member 30 is improved. Note that, it is also possible to omit the base frame 31 and form the base member 30 by only the base film 32.

As shown in FIG. 5, this base film 32 has: a base layer 322 on which interconnect patterns 321 are formed; and a cover layer 323 which covers this base layer 322 through an adhesive layer (not shown). Both of the base layer 322 and the cover layer 323 of the base film 32 comprise, for example, polyimide films. The interconnect patterns 321 are, for example, formed by etching copper foil which is laminated on the base layer 322. Note that, the cover layer 323 may also be omitted and the interconnect patterns 321 may be exposed on the base film 30.

As shown in FIG. 5 and FIG. 6, one end of each interconnect pattern 321 is exposed through an opening 323a which is formed in the cover layer 323. A bump 324 to which an electrode pad 41 of the die 50 is to be connected is formed on it. The bump 324 is, for example, composed of copper (Cu), nickel (Ni), etc. For example, the semi-additive method is used to form it on the end part of the interconnect pattern 321. This bump 324 is arranged so as to correspond to an electrode pad 41 of the die 50.

On the other hand, the position on the base frame 31 corresponding to the other end of the interconnect pattern 321 has a through hole 311 passing through it. The interconnect pattern 321 is connected through an opening 322a which is formed in the base layer 322 to the through hole 311. This through hole 311 is connected to an external terminal 312 which is formed on the bottom surface of the base frame 31. This external terminal 33 is contacted by a later explained contactor 125 of a electronic device test apparatus 10 when testing the electronic circuit which is built into the die 50.

Incidentally, FIG. 5 only shows two electrode pads 51, but in actuality, the die 50 is formed with a large number of electrode pads 51 at a narrow pitch. On the base film 32 as well, a large number of bumps 324 are arranged at a narrow pitch so as to correspond to the electrode pads 51. The bump 324 in the present embodiment is equivalent to one example of an internal terminal in the present invention. The die 50 in the present embodiment is equivalent to one example of an electronic device in the present invention, while the electrode pad 51 in the present embodiment is equivalent to one example of an electrode of the present invention.

Note that, the interconnect patterns 321 are not limited to the above configurations. For example, while not particularly shown, part of the interconnect patterns 321 may also be formed in real time by ink jet printing on the front surface of the base film 32. Alternatively, all of the interconnect patterns 321 may be formed by ink jet printing.

Further, the other ends of the interconnect patterns 321 may be positioned at the inside of the center opening 31a of the base frame 31 so as to form the external terminals 312 on the back surface of the base film 32. Alternatively, the other ends of the interconnect patterns 321 may be exposed on the top sides and external terminals 312 may be formed on the top surface of the base film 32.

As shown in FIG. 2 to FIG. 4, the cover member 40 comprises a cover frame 41 and a cover film 42. The cover film 42 in the present embodiment is equivalent to one example of the second member of the present invention.

The cover frame 41 is a rigid board which has a high rigidity (at least a rigidity higher than the base film 32 or the cover film 42) and is formed with an opening 41a at its center. In the present embodiment, this cover frame 41, in the same way as the above-mentioned base frame 31, is for example composed of a polyamide imide resin, ceramic, glass, etc.

On the other hand, the cover film 42 is a film which has flexibility and is attached to the entire surface of the cover frame 41, including the center opening 41a, through a binder (not shown). In the present embodiment, since the cover frame 41 with a high rigidity is attached to the cover film 42 which has flexibility, the handling ability of the cover member 40 is improved. Note that, the cover member 40 may also comprise only the cover film 42. Alternatively, the cover member 40 may also comprise only a rigid board which is not formed with the opening 41a.

Further, for example when both the top and bottom surfaces of the die 50 are formed with electrode pads 51, in addition to the base member 30, the cover member 40 can also be formed with interconnect patterns. In this case, by the same procedure with the above-mentioned base frame 31 and base film 32, the cover frame 41 is formed with external terminals and through holes and the cover film 42 is formed with interconnect patterns or bumps.

The above explained test carrier 20 is assembled as explained next.

That is, first, in the state where the electrode pads 51 are aligned with the bumps 324, the die 50 is placed on the base member 30.

Next, under an environment which is reduced in pressure compared with atmospheric pressure, the cover member 40 is laid over the base member 30 and the die 50 is interposed between the base member 30 and the cover member 40. At this time, the base film 32 of the base member 30 and the cover film 42 of the cover member 40 are made to directly contact each other by the cover member 40 being laid on the base member 30.

Next, still in the state with the die 50 interposed between the base member 30 and the cover member 50, the test carrier 20 is returned to an atmospheric pressure environment so that the die 40 is held in the holding space 21 (see FIG. 3) which is formed between the base member 30 and the cover member.

Incidentally, the electrode pads 51 of the die 50 and the bumps 324 of the base film 32 are not fastened by solder etc. In the present embodiment, the space between the base member 30 and the cover member 40 is a negative pressure compared with atmospheric pressure, so the die 50 is pressed by the base film 32 and the cover film 42 and the electrode pads 41 of the die 50 and the bumps 324 of the base film 32 contact each other.

Note that, as shown in FIG. 3, the base member 30 and the cover member 40 may also be fastened to each other at a bonded part 325 so as to prevent positional deviation and to improve the seal. As the binder 326 which forms this bonded part 325 (see FIG. 2 and FIG. 4 to FIG. 6), for example, a UV curing type binder etc. may be illustrated. This binder 326 is coated in advance on the base member 30 at positions corresponding to the outer periphery of the cover member 40, the base member 30 is covered with the cover member 40, then UV rays are irradiated to cure that binder whereby the bonded part 325 is formed.

Further, when the die 50 is relatively thick, conversely from the configuration which is shown in FIG. 3, the base member 30 and the cover member 40 may be superposed so that the rigid board 31 and the rigid board 41 directly contact each other.

Further, in the present embodiment, as explained later, the pushing mechanism 13 is used to push the base film 32, so the space between the base member 30 and the cover member 40 need not be reduced in pressure.

Next, the configuration of the electronic device test apparatus 10, which is used for testing (FIG. 1, step S30) of the die 50 which has been provisionally packaged in the test carrier 20, will be explained while referring to FIG. 7 to FIG. 12. Note that, the configuration of the electronic device test apparatus 10 which is explained below is only one example. The invention is not particularly limited to this.

Figure 7:
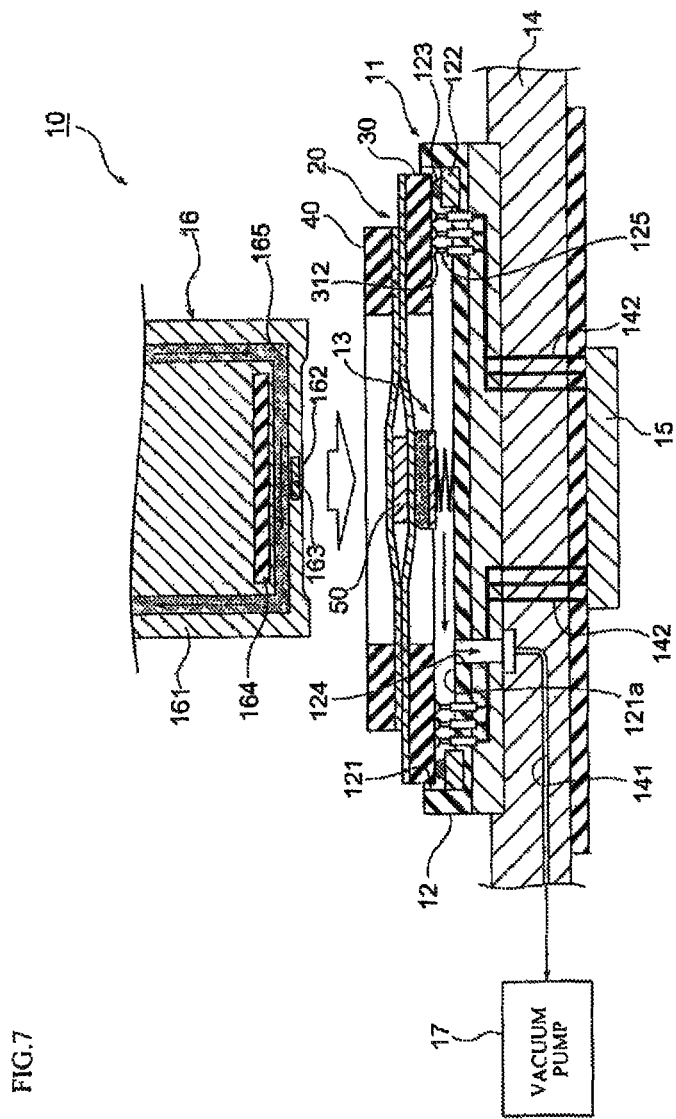
FIG. 7 is a cross-sectional view which shows the configuration of an electronic device test apparatus in an embodiment of the present invention.
Figure 8:
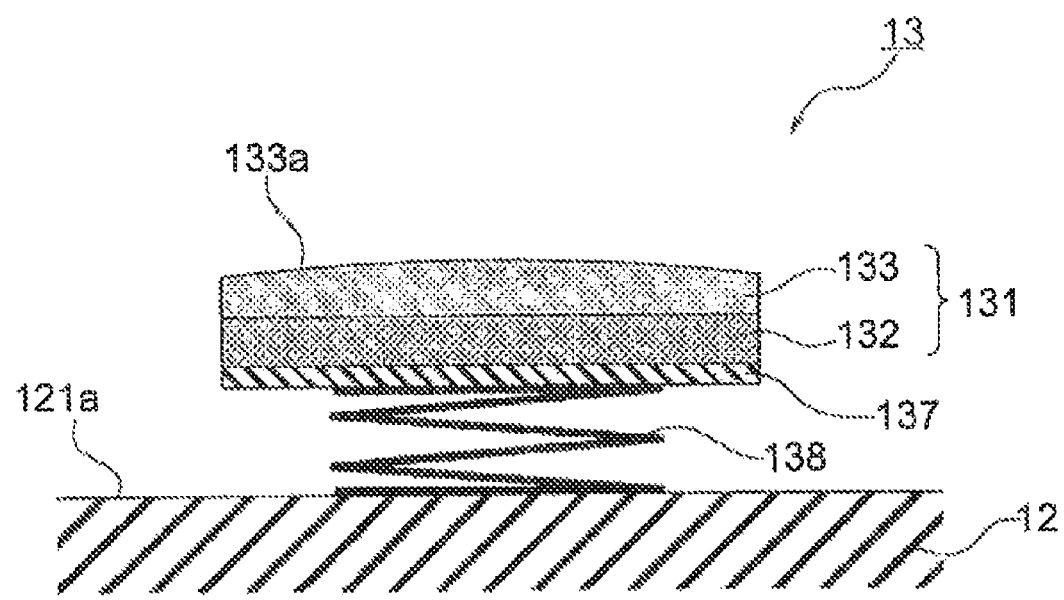
FIG. 8 is a cross-sectional view which shows the configuration of a pushing mechanism in an embodiment of the present invention.
Figure 9:
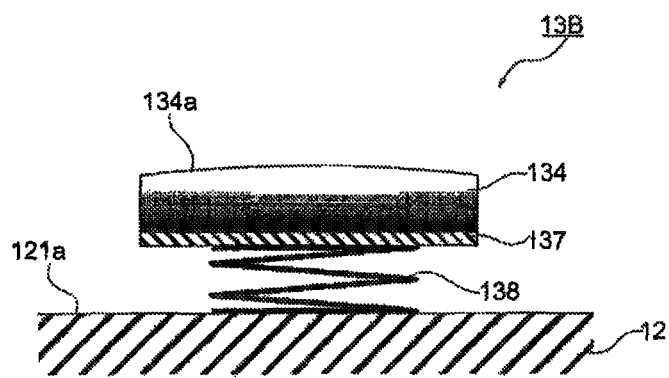
FIG. 9 is a cross-sectional view which shows a first modification of the pushing mechanism in an embodiment of the present invention.
Figure 10:
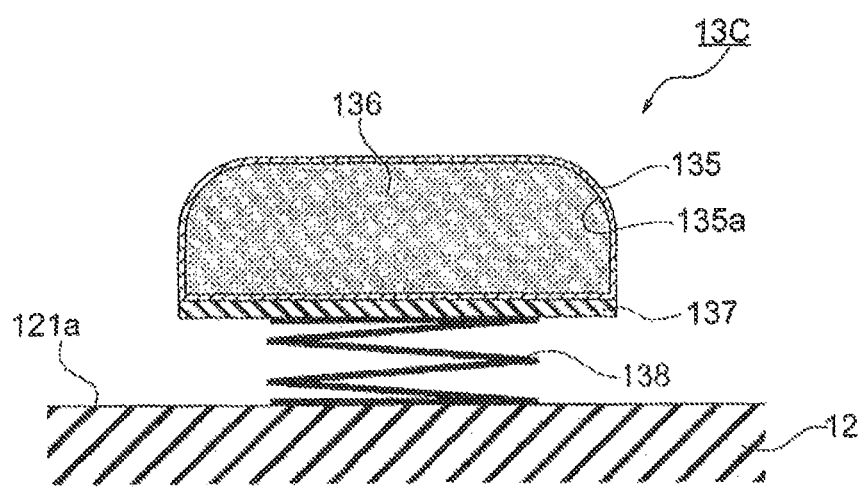
FIG. 10 is a cross-sectional view which shows a second modification of the pushing mechanism in an embodiment of the present invention.
Figure 11:
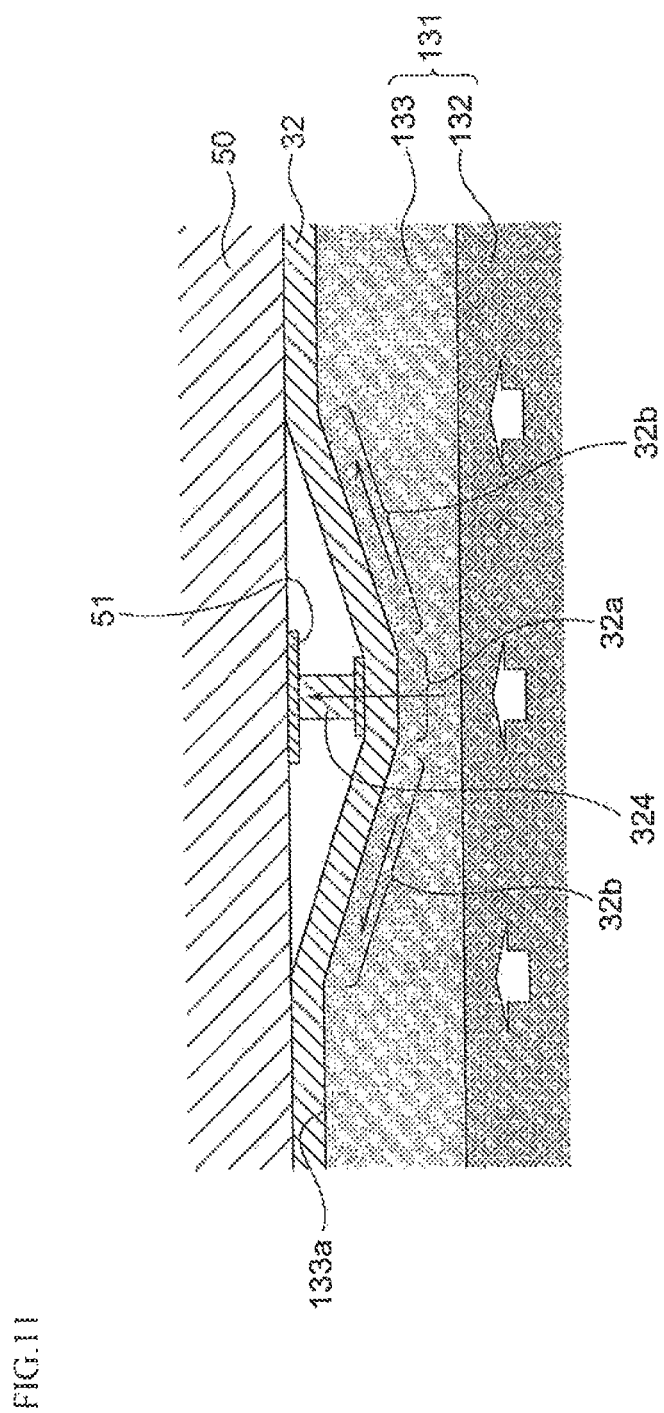
FIG. 11 is a cross-sectional view which shows a base film of a test carrier which is pushed by the pushing mechanism which is shown in FIG. 8.
Figure 12:
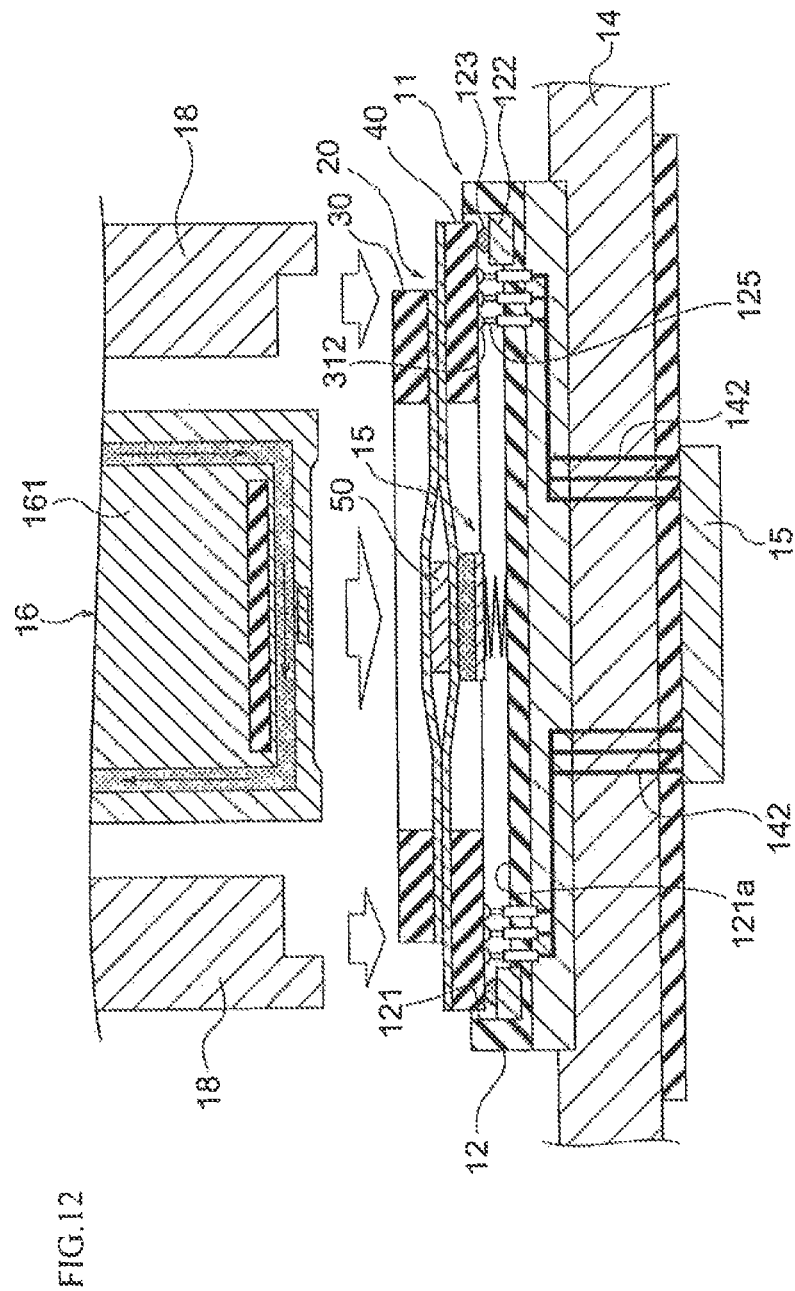
FIG. 12 is a cross-sectional view which shows a modification of an electronic device test apparatus in an embodiment of the present invention.

FIG. 7 is a cross-sectional view which shows the configuration of an electronic device test apparatus in the present embodiment, FIG. 8 is a cross-sectional view which shows the configuration of the pushing mechanism in the present embodiment, FIG. 9 and FIG. 10 are cross-sectional views which show modifications of the pushing mechanism in the present embodiment, FIG. 11 is a cross-sectional view which shows a base film of a test carrier which is pushed by the pushing mechanism which is shown in FIG. 8, and FIG. 12 is a cross-sectional view which shows a modification of an electronic device test apparatus in the present embodiment.

The electronic device test apparatus 10 in the present embodiment, as shown in FIG. 7, comprises a socket 11, board 14, test circuit 15, and temperature regulating head 16. Further, the socket 11 has: a pocket 12 in which the test carrier 20 is to be placed; and a pushing mechanism 13 which pushes the base film 32 of the test carrier 20.

The pocket 12 has a recess 121 which can accommodate the test carrier 20. At the outer circumferential part of this recess 121, a stopper 122 which has a seal member 123 at the top is provided extending along the entire circumference. As the seal member 123, for example, a rubber packing etc. can be used. When the outer periphery of the test carrier 20 abuts against the seal member 123, the recess 121 is sealed tight.

The pushing mechanism 13, as shown in FIG. 7, is provided on a bottom surface 121a of the recess 121 of the pocket 12 and is arranged at the approximate center of the inside of that recess 121. This pushing mechanism 13 is designed to be able to abut against the base film 32 when the test carrier 20 is placed inside of the pocket 12. In the present embodiment, the pushing mechanism 13 faces the die 50 as a whole through the base film 32, but the invention is not partially limited to this. It is sufficient that the pushing mechanism 13 faces the die 50 through the base film 32 so as to include at least all of the electrode pads 51 on the die 50.

This pushing mechanism 13, as shown in FIG. 8, comprises: a rubber member 131 which abuts against the bottom surface of the base film 32; a flat plate support member 137 which supports the rubber member 131; and a coil spring 138 which is interposed between the support member 137 and the bottom surface 121a of the pocket 121. Note that, instead of the coil spring 138, a rubber or other elastic member, a motor with a ball screw mechanism, a cylinder, etc. may also be interposed between the support member 137 and the bottom surface of the pocket 121. Alternatively, the support member 137 and the coil spring 138 may be omitted and the rubber member 131 may be directly fastened to the bottom surface 121a of the pocket 121.

The rubber member 131 has two rubber layers 132, 133, The first rubber layer 132 is laid on the support member 137 and, for example, is composed of silicone rubber with a Shore A hardness of 50 degrees. On the other hand, the second rubber layer 133 is laid on the first rubber layer 132 and, for example, is composed of silicone rubber with a Shore A hardness of 5 degrees.

That is, in the present embodiment, the second rubber layer 133 has a Young's modulus which is relatively smaller than the Young's modulus of the first rubber layer 132. Note that, the elastic materials which form the first and the second rubber layers 132, 133 are not particularly limited to this. It is sufficient that the second rubber layer 133 be softer than the first rubber layer 132. Further, if the layer becomes softer with distance to the test carrier 20 (in proportion to being closer to the test carrier), the number of rubber layers which form the rubber member 131 is not particularly limited. The first elastic layer 152 in the present embodiment is equivalent to one example of the first elastic member in the present invention, while the second elastic member 153 in the present embodiment is equivalent to one example of the second elastic member in the present invention.

The second rubber layer 133 has a top surface 133a which contacts the bottom surface of that base film 32 when the pushing mechanism 13 pushes the base film 32 of the test carrier 20. This top surface 133a, as shown in FIG. 8, has a projecting shape which becomes successively higher with distance to the center of that top surface 133a (in proportion to being closer to the center). For this reason, when the pushing mechanism 13 contacts the base film 32, the second rubber layer 133 as a whole can be made to evenly contact the base film 32.

Note that, the configuration of the pushing mechanism is not particularly limited. For example, a pushing mechanism such as shown in FIG. 9 or FIG. 10 can also be used.

The rubber member 134 of the pushing mechanism 13B which is shown in FIG. 9 is configured from a single rubber layer which becomes gradually more flexible with distance from the support member 137 (in proportion to being further upward from the support member). In this example as well, the top surface 134a of the rubber member 134 has a projecting shape which becomes gradually higher with distance to the center of that top surface 134a (in proportion to being closer to the center).

On the other hand, the pushing mechanism 13C which is shown in FIG. 10 comprises, instead of the rubber member 131, a bag member 135 which is provided on the support member 137. This bag member 135 is, for example, composed of silicone rubber or other resin material which is flexible and has elasticity. The internal space 135a holds a gas or liquid fluid 136 inside of it.

As a specific example of a fluid 136, for example, silicone grease or air etc. can be mentioned. Note that, this fluid 136 may be filled completely in the internal space 135a of the bag member 135, but an amount of fluid 136 less than complete may also be filled in the internal space 135a.

The above explained pushing mechanisms 15, 15B, or 15C is equivalent to one example of the first pusher in the present invention.

Returning to FIG. 7, the pocket 12 is mounted on the board 14. At the bottom surface of the pocket 12, a suction port 124 is opened. This suction port 124 is connected to a vacuum pump 17 through a communication path 141 which is formed at the inside of the board 14.

Further, for example pogo pins or other contactors 125 are arranged inside of the recess 121 so as to correspond to the external terminals 312 of the test carrier 20. The contactors 125 are electrically connected through interconnect patterns 142, which are formed inside of the board 14, to a test circuit (tester chip) 15 which is mounted on the back surface of the board 14. Note that, the test circuit 15 may also be mounted on the top surface of board 14. In this case, the test circuit 15 is arranged at a side of the pocket 12.

The tester circuit 15 in the present embodiment is a chip which has the function of testing the electronic circuits which are built in the die 50, that is, a one-chip tester which is provided with the functions of a conventional tester. Note that, the one-chip type of tester circuit 15 is just one example. For example, it is also possible to use a MCM (Multi-Chip Module) etc. to form the tester circuit or use a conventional tester instead of a tester circuit 15. The one-chip type of test circuit, MCM test circuit, or conventional tester in the present embodiment is equivalent to examples of the test circuit in the present invention.

The temperature regulating head 16, as shown in FIG. 7, has a block 161 which has an abutting surface 162 which abuts against the cover film 42 of the cover member 40 of the test carrier 20. The block 161 has a temperature sensor 163 and a heater 164 embedded in it. A flow path 165 through which a coolant can flow is formed in the block 161. This flow path 165 is connected to a not shown chiller.

The block 161 of this temperature regulating head 16 can approach/move away from the test carrier 20 placed in the pocket 12 by a not particularly shown motor with a ball screw mechanism, cylinder, etc. In the state where the abutting face 162 of the block 161 of this temperature regulating head 16 contacts the cover film 42 of the test carrier 20, the temperature sensor 163 measures the temperature of the die 50 during the test and the measurement results are used as the basis to control the temperature of the die 50 by the heater 164 and the coolant inside the flow path 165. Note that, the temperature regulating head 14 in embodiment is equivalent to one example of the second pusher in the present invention.

In the present embodiment, when a robot arm or pick-and-place apparatus or other handling apparatus (not shown) is used to place the test carrier 20 in a pocket 12, the base member 30 of that test carrier 20 and the seal member 132 of the pocket 12 are used to seal the recess 121. In this state, when operating the vacuum pump 17 to reduce the pressure inside of the recess 121, the test carrier 20 is pulled toward the inside of the pocket 12 whereby the contactor 125 and the external terminals 312 contact each other.

Further, when the temperature regulating head 16 approaches and abuts against test carrier 20, the heater 164 and the coolant which flows through the flow path 165 are used to control the temperature of the die 50. At the same time as this, the rubber member 131 of the pushing mechanism 13 contacts and pushes against the bottom surface of the base film 32 of the test carrier 20.

In this pushing action of the rubber member 131, as shown in FIG. 11, first, the soft second rubber layer 133 deforms to follow the portion 32b surrounding the bump 324 in the base film 32 (below, simply referred to as the "bump-surrounding portion 32b") and pushes and extends the bump-surrounding portion 32b of the base film 32 around the bumps 324. Note that, the bump-surrounding portion 32b in the present embodiment is equivalent to "the portion of the first member surrounding the internal terminal" in the present invention.

At this time, the top surface 133a of the second rubber layer 133 has a projecting shape which becomes gradually higher with distance to the center, so the second rubber layer 133 as a whole can be made to evenly contact the base film 32.

Further, when the second rubber layer 133 deforms and the bump-surrounding portion 32b is given sufficient tension, the first rubber layer 132 harder than the second rubber layer 133 pushes the portion 32a where the bumps 324 are formed in the base film 32 (below, simply referred to as the "bump-forming portion 32a") toward the electrode pads 51 of the die 50 whereby the bumps 324 and the electrode pads 51 contact each other. In this state, the test circuit 15 sends and receives test signals through the test carrier 20 with the die 50 so as to test the electronic circuit which is built into the die 50. Note that, the bump-forming portion 32a in the present embodiment is equivalent to the "the portion of the first member where the internal terminal is formed" in the present invention.

Note that, as shown in FIG. 12, instead of the vacuum pump 17, the pushing head 18 may also be used to directly push the rigid board 51 of the cover member 4 of the test carrier 20 from above so as to make the contactors 125 contact the external terminals 312 of the test carrier 20. This pushing head 18 can, for example, approach/move away from the test carrier 20 by a not particularly shown motor with a ball screw mechanism, cylinder, etc. Note that, the vacuum pump 17 or the pushing head 18 in the present embodiment is equivalent to one example of the contacting device in the present invention.

As explained above, in the present embodiment, a pushing mechanism 13 which has two rubber layers 132, 133 differing in Young's modulus is used to push not only the bump-forming portions 32a of the base film 32, but also the bump-surrounding portions 32b. For this reason, it is possible to push and extend the base film 32 and eliminate waviness of the base film 32 while making the bumps 324 of the test carrier 20 contact the electrode pads 51 of the die 50, so it is possible to suppress poor contact of the bumps 324 and electrode pads 51.

Further, in the present embodiment, the first rubber layer 132 and the second rubber layer 133 can be used to absorb warping of the die 50 and variation in height of the bumps 324.

Note that, the above explained embodiment was described to facilitate understanding of the present invention and was not described for limiting the present invention. Therefore, the elements which were disclosed in the embodiment include all design changes and equivalents falling under the technical scope of the present invention.

For example, a configuration reversing the positional relationship between the pushing mechanism 13 and the temperature regulating head 16 also falls under the technical scope of the present invention. That is, in FIG. 7, the pushing mechanism 13 may also be made to approach the test carrier 20 from above and provide a temperature regulating head 16 inside the pocket 12 of the socket 11.

REFERENCE SIGNS LIST

10 . . . electronic device test apparatus
11 . . . socket
12 . . . pocket
121 . . . recess
125 . . . contactor
13, 13B, 13C . . . pushing mechanism
131 . . . rubber member
132 . . . first rubber layer
133 . . . second rubber layer
133a . . . top surface
134 . . . rubber member
134a . . . top surface
135 . . . bag member
135a . . . internal space
136 . . . fluid
14 . . . board
15 . . . test circuit
16 . . . temperature regulating head
20 . . . test carrier
30 . . . base member
31 . . . base frame
312 . . . external terminals
32 . . . base film
32a . . . hump-forming portion
32b . . . bump-surrounding portion
324 . . . bump
40 . . . cover member

What is claimed is:

1. A socket to which a test carrier is electrically connected, the test carrier including: a film-shaped first member on which at least one internal terminal, which contacts at least one electrode of an electronic device, is provided; and at least one external terminal which is electrically connected to the internal terminal,
the socket comprising:
at least one contactor which contacts the external terminal; and
a first pusher which pushes a portion of the first member where the internal terminal is provided and a portion of the first member surrounding the internal terminal, wherein
the first pusher comprises:
a bag member which has a sealed space within the bag member; and
a fluid which is housed in the sealed space.

2. An electronic device test apparatus which tests an electronic device which is temporarily mounted to the test carrier, the electronic device test apparatus comprising:
the socket as set forth in claim 1;
a contacting device which brings the external terminal and the contactor into contact; and
a second pusher which pushes the test carrier from a direction opposite to the pushing direction of the first pusher.

3. The electronic device test apparatus as set forth in claim 2, wherein
the second pusher pushes a second member of the test carrier which holds the electronic device with a first member.

4. The electronic device test apparatus as set forth in claim 2, wherein
the electronic device is a die which is diced from a semiconductor wafer.

* * * * *